(12) United States Patent
Nagai et al.

(10) Patent No.: US 7,682,858 B2
(45) Date of Patent: Mar. 23, 2010

(54) WAFER PROCESSING METHOD INCLUDING FORMATION OF A DETERIORATED LAYER

(75) Inventors: Yusuke Nagai, Tokyo (JP); Satoshi Kobayashi, Tokyo (JP); Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 440 days.

(21) Appl. No.: 11/151,526

(22) Filed: Jun. 14, 2005

(65) Prior Publication Data

US 2005/0282359 A1 Dec. 22, 2005

(30) Foreign Application Priority Data

Jun. 22, 2004 (JP) .............................. 2004-183824

(51) Int. Cl.
*H01L 21/00* (2006.01)

(52) U.S. Cl. ........................... 438/33; 438/68; 438/113; 438/114

(58) Field of Classification Search ....................... None
See application file for complete search history.

(56) References Cited

U.S. PATENT DOCUMENTS

| | | | | |
|---|---|---|---|---|
| 4,096,619 | A * | 6/1978 | Cook, Jr. ...................... | 29/413 |
| 6,767,803 | B2 * | 7/2004 | Tsujimoto ..................... | 438/460 |
| 6,908,784 | B1 * | 6/2005 | Farnworth et al. ............ | 438/106 |
| 6,939,785 | B2 * | 9/2005 | Kajiyama et al. ............. | 438/463 |
| 7,005,317 | B2 * | 2/2006 | Chin et al. .................... | 438/106 |
| 7,008,861 | B2 * | 3/2006 | Andrews et al. .............. | 438/463 |
| 7,135,384 | B2 | 11/2006 | Takyu et al. | |
| 7,141,443 | B2 * | 11/2006 | Nagai et al. ................... | 438/33 |
| 7,179,721 | B2 * | 2/2007 | Nagai ............................ | 438/460 |
| 7,566,635 | B2 | 7/2009 | Fujii et al. | |
| 2002/0192927 | A1 * | 12/2002 | Yamada ........................ | 438/460 |

(Continued)

FOREIGN PATENT DOCUMENTS

CN 1525536 9/2004

(Continued)

OTHER PUBLICATIONS

Chinese Office Action corresponding to Patent Application No. 200510078996.9.

*Primary Examiner*—Laura M Menz
*Assistant Examiner*—James M Mitchell
(74) *Attorney, Agent, or Firm*—Smith, Gambrell & Russell, LLP (57) ABSTRACT

A wafer processing method for dividing a wafer having function elements in area sectioned by dividing lines formed on the front surface in a lattice pattern into individual chips along the dividing lines, comprising a deteriorated layer forming step for forming a deteriorated layer on the side of the back surface of a position at a distance corresponding to the final thickness of the chip from the front surface of the wafer by applying a laser beam capable of passing through the wafer along the dividing lines from the back surface of the wafer; a dividing step for dividing the wafer into individual chips along the dividing lines by applying external force to the wafer in which the deteriorated layer has been formed along the dividing lines; and a back surface grinding step for grinding the back surface of the wafer divided into individual chips to the final thickness of the chip.

8 Claims, 10 Drawing Sheets

U.S. PATENT DOCUMENTS

| | | | |
|---|---|---|---|
| 2004/0121563 A1* | 6/2004 | Farnworth et al. | 438/465 |
| 2004/0142284 A1* | 7/2004 | Sakaguchi et al. | 430/311 |
| 2004/0198024 A1* | 10/2004 | Yoon et al. | 438/463 |
| 2004/0241962 A1* | 12/2004 | Nagai | 438/460 |
| 2005/0006725 A1* | 1/2005 | Kurosawa et al. | 257/618 |
| 2005/0023260 A1* | 2/2005 | Takyu et al. | 219/121.67 |
| 2007/0218651 A1* | 9/2007 | Higashino | 438/460 |

FOREIGN PATENT DOCUMENTS

| | | |
|---|---|---|
| JP | 2002-192370 | 7/2002 |
| JP | 2004-001076 A | 1/2004 |
| JP | 2004-079746 A | 3/2004 |
| JP | 2005-086111 A | 3/2005 |
| JP | 2005-101416 * | 4/2005 |
| WO | 03/077295 A1 | 9/2003 |

* cited by examiner

WAFER PROCESSING METHOD INCLUDING FORMATION OF A DETERIORATED LAYER

FIELD OF THE INVENTION

The present invention relates to a wafer processing method for dividing a wafer having function elements in areas sectioned by dividing lines formed on the front surface in a lattice pattern along the dividing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit (function element) such as IC or LSI is formed in each of the sectioned areas. Individual semiconductor chips are manufactured by cutting this semiconductor wafer along the dividing lines to divide it into the areas having a circuit formed thereon. An optical device wafer comprising photodetectors (function elements) such as photodiodes or light-emitting elements (function elements) such as laser diodes laminated on the front surface of a sapphire substrate is also cut along dividing lines to be divided into individual optical devices such as photodiodes or laser diodes which are widely used in electric equipment.

Cutting along the dividing lines of the above semiconductor wafer or optical device wafer is generally carried out by using a cutting machine called "dicer". This cutting machine comprises a chuck table for holding a workpiece such as a semiconductor wafer or an optical device wafer, a cutting means for cutting the workpiece held on the chuck table, and a cutting-feed means for moving the chuck table and the cutting means relative to each other. The cutting means has a spindle unit that comprises a rotary spindle, a cutting blade mounted on the spindle and a drive means for driving the rotary spindle. The cutting blade comprises a disk-like base and an annular cutting edge which is mounted on the side wall peripheral portion of the base and formed as thick as about 20 μm by fixing diamond abrasive grains having a diameter of about 3 μm to the base by electroforming.

Since the cutting blade has a thickness of about 20 μm, however, the dividing lines for sectioning chips must have a width of about 50 μm, and consequently, the area ratio of the dividing lines to the wafer is large, thereby reducing productivity. Further, since a sapphire substrate, silicon carbide substrate, etc. have high Mohs hardness, cutting with the above cutting blade is not always easy.

Meanwhile, as a means of dividing a plate-like workpiece such as a semiconductor wafer, a laser processing method for applying a pulse laser beam capable of passing through the workpiece with its focusing point set to the inside of the area to be divided is also attempted nowadays, and this method is disclosed by Japanese Patent No. 3408805. In the dividing method making use of this laser processing technique, the workpiece is divided by applying a pulse laser beam of an infrared range capable of passing through the workpiece from one side of the workpiece with its focusing point set to the inside to continuously form a deteriorated layer along the dividing lines in the inside of the workpiece, and exerting external force along the dividing lines whose strength has been reduced by the formation of the deteriorated layers.

The deteriorated layer, however, remains on the side surfaces of the chips obtained by dividing along the dividing lines in which the deteriorated layer has been formed as described above, and there is a problem that this remaining deteriorated layer causes reduction in the transverse rupture strength of the chips.

SUMMARY OF THE INVENTION

It is an object of the present invention to provide a wafer processing method in which a pulse laser beam is applied along the dividing lines of a wafer to form a deteriorated layer without reducing the transverse rupture strength of chips divided along the dividing lines in which the deteriorated layer has been formed.

According to the present invention, firstly, the above objects of the present invention is attained by a wafer processing method for dividing a wafer having function elements in area sectioned by dividing lines formed on the front surface in a lattice pattern, into individual chips along the dividing lines, comprising:

a deteriorated layer forming step for forming a deteriorated layer on the side of the back surface of a position at a distance corresponding to the final thickness of the chip from the front surface of the wafer by applying a laser beam capable of passing through the wafer along the dividing lines from the back surface of the wafer;

a dividing step for dividing the wafer into individual chips along the dividing lines by applying external force to the wafer in which the deteriorated layer has been formed along the dividing lines; and a back surface grinding step for grinding the back surface of the wafer divided into individual chips to the final thickness of the chip.

Preferably, a protective tape affixing step for affixing a protective tape to the front surface of the wafer is carried out before the above deteriorated layer forming step. Preferably, after the above protective tape affixing step, a polish-processing step for polishing the back surface of the wafer is carried out before the deteriorated layer forming step. Preferably, the thickness of the deteriorated layer formed by the above deteriorated layer forming step is set to 50% or more of the thickness of the wafer.

In the above dividing step, thermal stress is generated in the wafer by heating the dividing lines in which the deteriorated layer has been formed.

The above the dividing step comprises a frame supporting step for putting the back surface of the wafer subjected to the deteriorated layer forming step on an extensible support tape affixed to an annular frame and a tape expansion step for expanding the support tape affixed to the back surface of the wafer, and the above back surface grinding step comprises a wafer peeling step for peeling off the wafer from the support tape after the tape expansion step to grind the back surface of the wafer in a state where the protective tape is affixed to the front surface of the wafer.

According to the present invention, secondly, the above object of the present invention is attained by a wafer processing method for dividing a wafer having function elements in area sectioned by dividing lines formed on the front surface in a lattice pattern, into individual chips along the dividing lines, comprising:

a frame supporting step for putting the front surface of the wafer on a support tape affixed to an annular frame;

a deteriorated layer forming step for forming a deteriorated layer on the side of the back surface of a position at a distance corresponding to the final thickness of the chip from the front surface of the wafer by applying a laser beam capable of passing through the wafer along the dividing lines from the back surface of the wafer supported by the annular frame through the support tape;

a dividing step for dividing the wafer into individual chips along the dividing lines by applying external force to the wafer in which the deteriorated layer has been formed along the dividing lines; and a back surface grinding step for grinding the back surface of the wafer divided into individual chips to the final thickness of the chip.

Preferably, after the above frame supporting step, a polish-processing step for polishing the back surface of the wafer is carried out before the above deteriorated layer forming step. Preferably, the thickness of the deteriorated layer formed by the deteriorated layer forming step is set to 50% or more of the thickness of the wafer.

In the above dividing step, thermal stress is generated in the wafer by heating the dividing lines in which the deteriorated layer has been formed.

The support tape affixed to the annular frame is an extensible tape and expanded in the dividing step.

According to the wafer processing method in the present invention, the deteriorated layer formed along the dividing lines of the wafer by the deteriorated layer forming step is removed by carrying out the step of grinding the back surface to the final thickness of the chip after the wafer is divided into individual chips along the dividing lines. Therefore, as the deteriorated layer does not remain on the side surfaces of the chip, the transverse rupture strength of the chip does not lower.

DETAILED DESCRIPTION OF THE PREFERRED EMBODIMENTS

Preferred embodiments of the present invention will be described in detail hereinunder with reference to the accompanying drawings.

Figure 1:
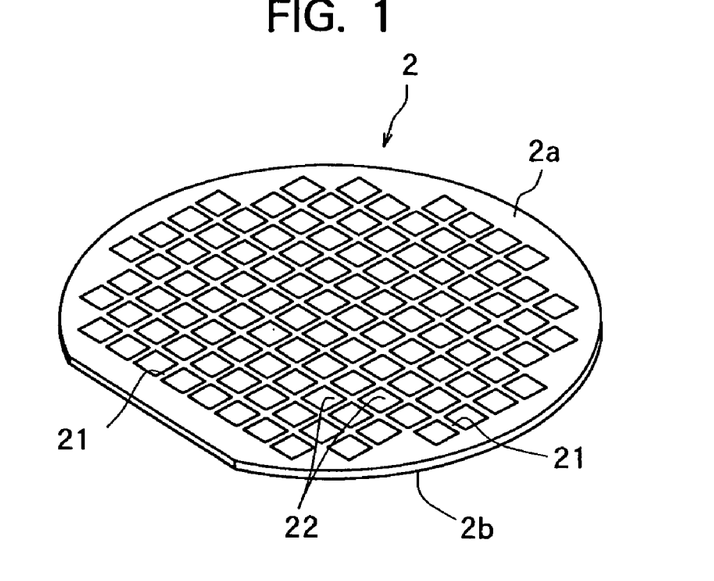
FIG. 1 is a perspective view of a semiconductor wafer as a wafer to be divided by the wafer processing method of the present invention.
Figure 2:
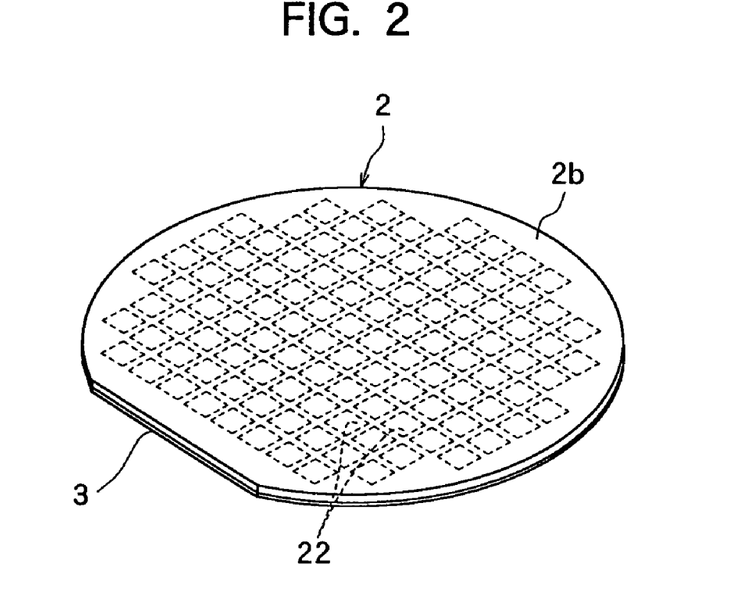
FIG. 2 is a perspective view showing a state where the front surface of the semiconductor wafer shown in FIG. 1 is put on a protective tape.

FIG. 1 is a perspective view of a semiconductor wafer as a wafer to be processed according to the present invention. The semiconductor wafer 2 shown in FIG. 1 is a silicon wafer with a thickness of, for example, 500 μm, which has a plurality of dividing lines 21 formed in a lattice pattern on the front surface 2a and circuits 22 formed as function elements in a plurality of areas sectioned by the plurality of dividing lines 21. A protective tape 3 is affixed to the front surface 2a of the thus constituted semiconductor wafer 2, as shown in FIG. 2 (protective tape affixing step).

Figure 3:
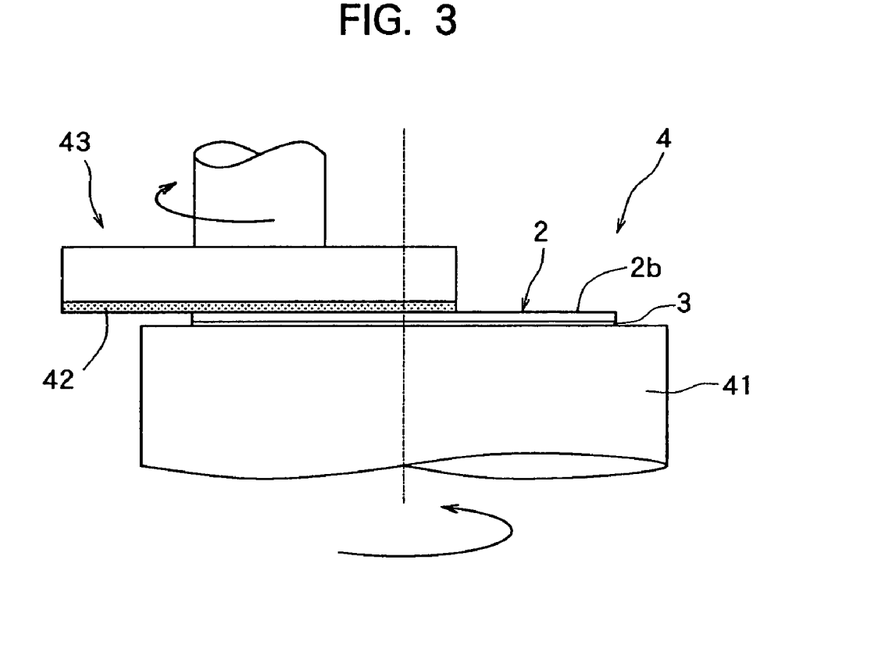
FIG. 3 is an explanatory diagram showing a mirror-finishing step in the wafer processing method of the present invention.

After the protective tape affixing step is carried out to affix the protective tape 3 to the front surface 2a of the semiconductor wafer 2, next comes a polish-processing step for grinding or polishing the back surface 2b of the semiconductor wafer 2 to form a desired thickness and performing a polish-processing step for mirror finish-processing the back surface 2b of the semiconductor wafer 2 by polishing it. This polish-processing step is carried out in order to prevent diffused reflection of an infrared laser beam applied from the back surface 2b of the semiconductor wafer 2. That is, this is because when an infrared laser beam is applied with its focusing point set to the inside of a wafer formed of silicon or the like, if the surface exposed to the infrared laser beam is rough, the infrared laser beam is diffused on the surface and does not reach a predetermined focusing point, thereby making it difficult to form a predetermined deteriorated layer in the inside of the wafer. This polish-processing step is carried out by using a polishing machine 4 in the embodiment shown in FIG. 3. That is, in the polish-processing step, the protective tape 3 side of the semiconductor wafer 2 is first placed on the chuck table 41 of the polishing machine 4 (therefore, the back surface 2b of the semiconductor wafer 2 faces up) and the semiconductor wafer 2 is suction-held on the chuck table 41 by a suction means (not shown), as shown in FIG. 3. Then, a polishing tool 43 having a grindstone 42 manufactured by dispersing abrasive grains such as zirconia oxide or the like into a soft member such as felt and fixing them with a suitable adhesive is rotated at 6,000 rpm, for example, and brought into contact with the back surface 2b of the semiconductor wafer 2 while the chuck table 41 is rotated at, for example, 300 rpm to polish-process the back surface 2b of the semiconductor wafer 2. In this polish-processing step, the back surface 2b which is the processing surface of the semiconductor wafer 2 is polish-processed to a surface roughness (Ra) specified by JIS B0601 of 0.05 μm or less (Ra≦0.05 μm), preferably 0.02 μm or less (Ra≦0.02 μm).

Next comes a deteriorated layer forming step for forming a deteriorated layer on the side of the back surface 2b of a position at a distance corresponding to the final thickness of the chip from the front surface 2a along the dividing lines, in the inside of the semiconductor wafer 2 by applying a pulse laser beam capable of passing through the wafer along the dividing lines from the polished back surface 2b side of the semiconductor wafer 2. This deteriorated layer forming step is carried out by using a laser beam processing machine 5 shown in FIGS. 4 to 6. The laser beam processing machine 5 shown in FIGS. 4 to 6 comprises a chuck table 51 for holding a workpiece, a laser beam application means 52 for applying a laser beam to the workpiece held on the chuck table 51, and an image pick-up means 53 for picking up an image of the workpiece held on the chuck table 51. The chuck table 51 is so constituted as to suction-hold the workpiece, and is moved in a processing-feed direction indicated by an arrow X and an indexing-feed direction indicated by an arrow Y in FIG. 4 by a moving mechanism that is not shown.

Figure 5:
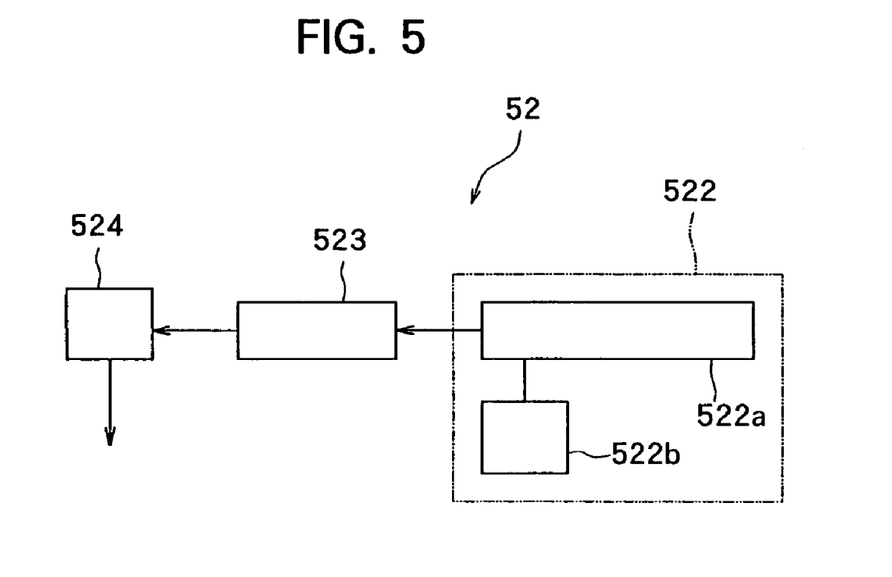
FIG. 5 is a block diagram schematically showing the constitution of laser beam application means provided in the laser beam processing machine shown in FIG. 4.
Figure 6:
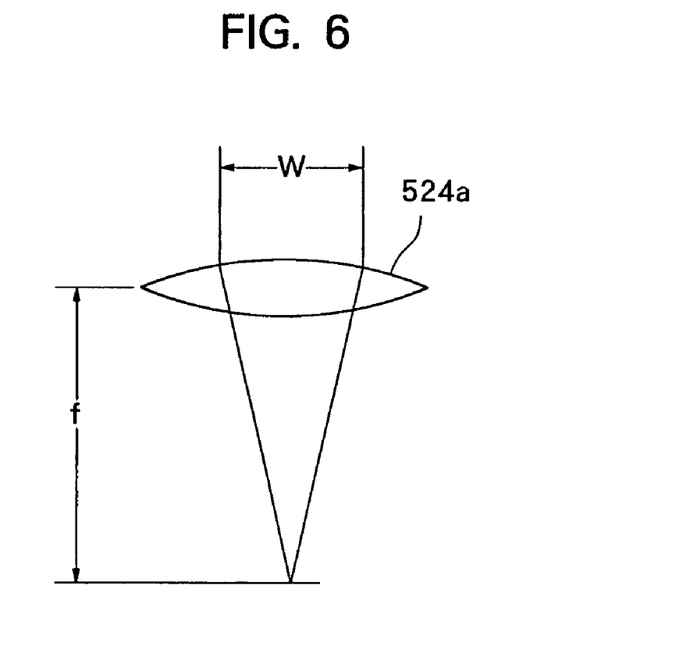
FIG. 6 is a schematic diagram for explaining the focusing spot diameter of a pulse laser beam.

The above laser beam application means 52 comprises a cylindrical casing 521 arranged substantially horizontally. In the casing 521, as shown in FIG. 5, there are installed a pulse laser beam oscillation means 522 and a transmission optical system 523. The pulse laser beam oscillation means 522 is constituted by a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter, etc. A condenser 524 housing condensing lenses (not shown) constituted by a set of lenses that may be formation known per se is mounted onto the end of the above casing 521. A laser beam oscillated from the above pulse laser beam oscillation means 522 reaches the condenser 524 through the transmission optical system 523 and is applied from the condenser 524 to the workpiece held on the above chuck table 51 at a predetermined focusing spot diameter D. This focusing spot diameter D is defined by an expression D (μm)=4×λ×f/(π×W) (wherein λ is the wavelength (μm) of the pulse laser beam, W is the diameter (mm) of the pulse laser beam applied to an objective lens 524a, and f is the focusing distance (mm) of the objective lens 524a) when the pulse laser beam showing a Gaussian distribution is applied through the objective condenser lens 524a of the condenser 524, as shown in FIG. 6.

The image pick-up means 53 mounted on the end of the casing 521 constituting the above laser beam application means 52 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. A picked-up image signal is transmitted to a control means that is not shown.

The deteriorated layer forming step which is carried out by using the above laser beam processing machine 5 will be described with reference to FIG. 4, FIGS. 7(a) and 7(b) and FIG. 8.

Figure 4:
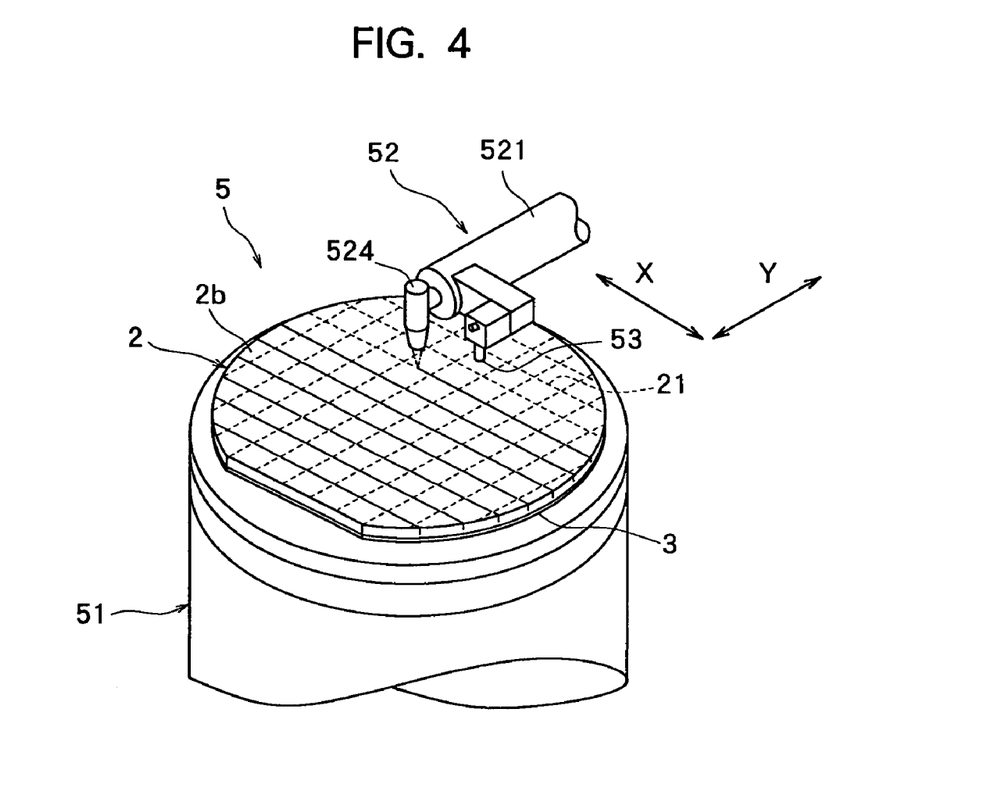
FIG. 4 is a perspective view of the principal section of a laser beam processing machine for carrying out the deteriorated layer forming step in the wafer processing method of the present invention.

In this deteriorated layer forming step, the protective tape 3 side of the semiconductor wafer 2 whose back surface 2b has been polished is first placed on the chuck table 51 of the laser beam processing machine 5 shown in FIG. 4 (therefore, the polished back surface 2b of the semiconductor wafer 2 faces up), and the semiconductor wafer 2 is suction-held on the chuck table 51 by a suction means that is not shown. The chuck table 51 suction-holding the semiconductor wafer 2 is brought to a position right below the image pick-up means 53 by a moving mechanism that is not shown.

After the chuck table 51 is positioned right below the image pick-up means 53, alignment work for detecting the area to be processed of the semiconductor wafer 2 is carried out by using the image pick-up means 53 and the control means that is not shown. That is, the image pick-up means 53 and the control means (not shown) carry out image processing such as pattern matching to align a dividing line 21 formed in a predetermined direction of the semiconductor wafer 2 with the condenser 524 of the laser beam application means 52 for applying a laser beam along the dividing line 21, thereby performing the alignment of a laser beam application position. The alignment of the laser beam application position is also carried out on dividing lines 21 that are formed on the semiconductor wafer 2 and extend in a direction perpendicular to the above predetermined direction. Although the front surface 2a of the semiconductor wafer 2 on which the dividing line 21 is formed faces down at this point, as the image pick-up means 53 has an infrared illuminating means, an optical system for capturing infrared radiation and an image pick-up device (infrared CCD) for outputting an electric signal corresponding to the infrared radiation as described above, an image of the dividing line 21 can be taken through the back surface 2b.

Figure 7:
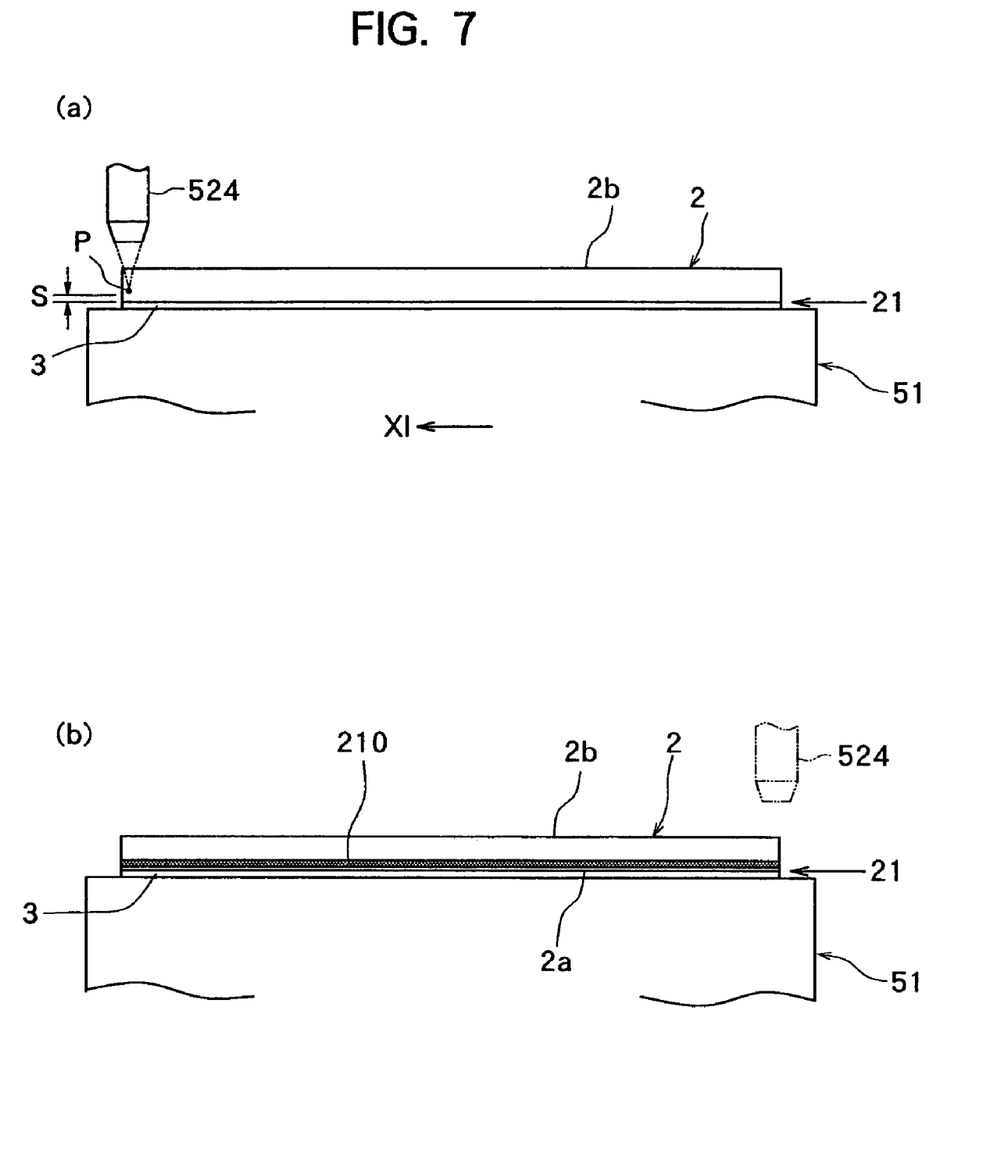
FIGS. 7(a) and 7(b) are explanatory diagrams showing the deteriorated layer forming step in the wafer processing method of the present invention.
Figure 8:
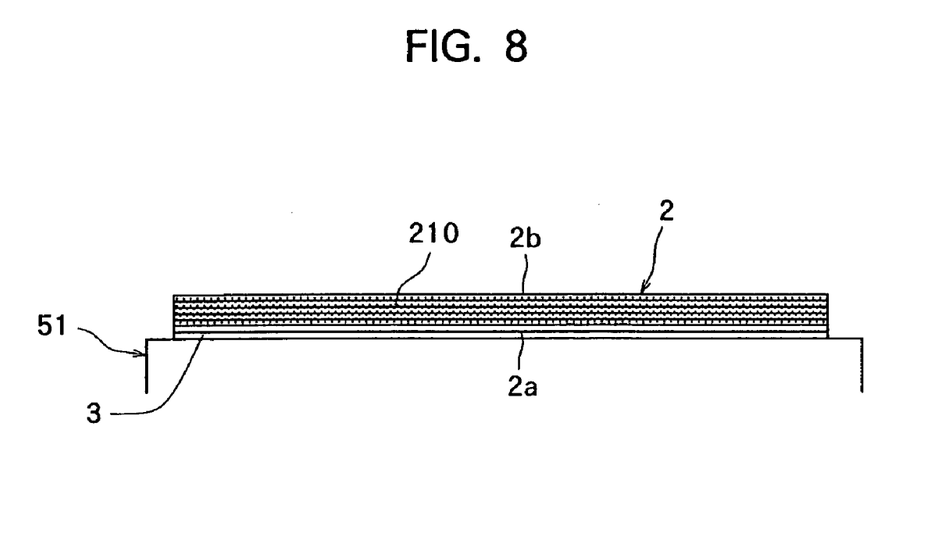
FIG. 8 is an explanatory diagram showing a state where a plurality of deteriorated layers are laminated along the dividing line of the wafer by the deteriorated layer forming step in the wafer processing method of the present invention.

After the dividing line 21 formed on the semiconductor wafer 2 held on the chuck table 51 is detected and the alignment of the laser beam application position is carried out as described above, the chuck table 51 is moved to a laser beam application area where the condenser 524 of the laser beam application means 52 for applying a laser beam is located as shown in FIG. 7(a) to bring one end (left end in FIG. 7(a)) of the predetermined dividing line 21 at a position right below the condenser 524 of the laser beam application means 52. Thereafter, the focusing point P of a pulse laser beam applied from the condenser 524 is set on the side of the back surface 2b (top surface) of a position at a distance corresponding to the final thickness S of the chip from the front surface 2a (undersurface) of the semiconductor wafer 2. That is, when the final thickness S of the chip is 100 μm, the focusing point P of the pulse laser beam is set to, for example, a position 150 μm above the front surface 2a (undersurface) of the semiconductor wafer 2. The chuck table 51, that is, the semiconductor wafer 2 is then moved in the direction indicated by the arrow X1 in FIG. 7(a) at a predetermined feed rate while the pulse laser beam capable of passing through the silicon wafer is applied from the condenser 524. When the application position of the condenser 524 of the laser beam application means 52 reaches the other end of the dividing line 21 as shown in FIG. 7(b), the application of the pulse laser beam is suspended and the movement of the chuck table 51, that is, the semiconductor wafer 2 is stopped. As a result, in the inside of the semiconductor wafer 2, a deteriorated layer 210 is formed on the back surface 2b (top surface) side of the position 150 μm above the front surface 2a (undersurface) along the dividing line 21. When the semiconductor wafer 2 is thick, as shown in FIG. 8, the above-described deteriorated layer forming step is carried out several times by changing the focusing point P stepwise so as to form a plurality of deteriorated layers 210. The thickness of the deteriorated layer 210 is desirably 50% or more of the thickness of the semiconductor wafer 2. This deteriorated layer 210 is formed as a molten re-solidified layer, of which the wafer has been once molten and then re-solidified.

The processing conditions in the above deteriorated layer forming step are set as follows, for example.

Light source: LD excited Q switch Nd:YVO4 laser
Wavelength: pulse laser having a wavelength of 1,064 nm
Pulse output: 10 µJ
Focusing spot diameter: 1 µm
Repetition frequency: 100 kHz
Processing-feed rate: 100 mm/sec After the above deteriorated layer forming step is carried out along the predetermined dividing line 21 as described above, the chuck table 51, therefore, the semiconductor wafer 2 held on the chuck table 51 is indexing-moved by a distance corresponding to the interval between dividing lines 21 in the direction indicated by the arrow Y (indexing step) to carry out the above deteriorated layer forming step. After the above deteriorated layer forming step is carried out along all the dividing lines 21 formed in the predetermined direction, the chuck table 51, therefore, the semiconductor wafer 2 held on the chuck table 51 is turned at 90° to carry out the above deteriorated layer forming step along dividing lines 21 formed in a direction perpendicular to the above predetermined direction.

After the deteriorated layer 210 is formed along the dividing lines 21 in the inside of the semiconductor wafer 2 by the above deteriorated layer forming step, next comes a dividing step of dividing the semiconductor wafer 2 into individual chips along the dividing lines 21 by applying external force to the semiconductor wafer 2 in which the deteriorated layer 210 has been formed along the dividing lines 21.

Figure 9:
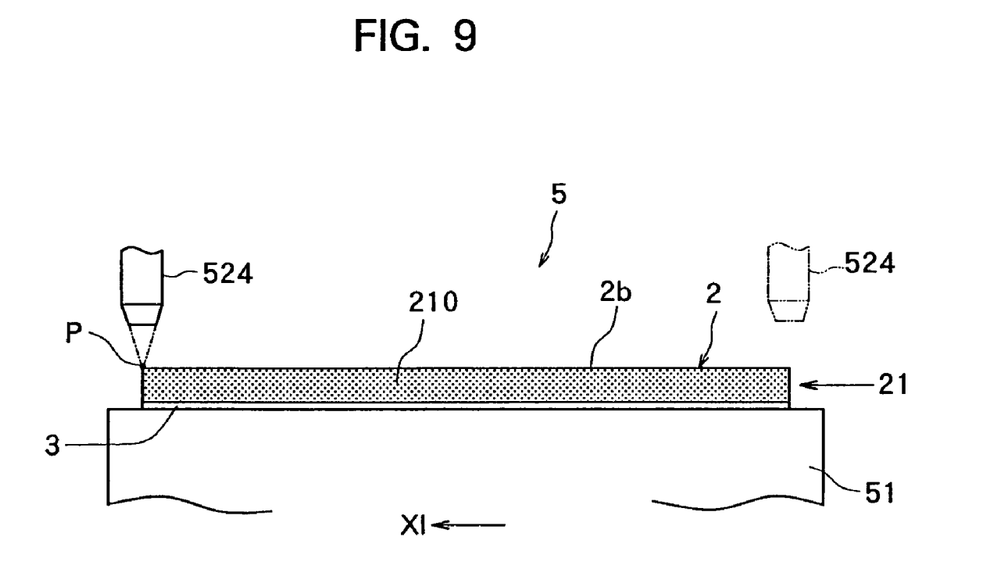
FIG. 9 is an explanatory diagram showing an embodiment of the dividing step in the wafer processing method of the present invention.

An embodiment of the dividing step will be described with reference to FIG. 9. The dividing step shown in FIG. 9 is carried out by using the same laser beam processing machine as the laser beam processing machine 5 shown in FIGS. 4 to 6. That is, the protective tape 3 side of the semiconductor wafer 2 in which the deteriorated layer 210 has been formed along the dividing lines 21 is placed on the chuck table 51 of the laser beam processing machine 5 (therefore, the back surface 2b of the semiconductor wafer 2 faces up) and the semiconductor wafer 2 is suction-held by a suction means (not shown), as shown in FIG. 9. Thereafter, the chuck table 51 is moved to the laser beam application area where the condenser 524 of laser beam application means is located to bring one end (left end in FIG. 9) of a predetermined dividing line 21 at a position right below the condenser 524. The chuck table 51, that is, the semiconductor wafer 2 is then moved in the direction indicated by the arrow X1 in FIG. 9 at a predetermined feed rate while a continuous wave laser beam having absorptivity for the semiconductor wafer 2 is applied from the condenser 524. When the application position of the condenser 524 reaches the other end (right end in FIG. 9) of the predetermined dividing line 21, the application of the laser beam is suspended and the movement of the chuck table 51, that is, the semiconductor wafer 2 is stopped. In this dividing step, the focusing point P of the continuous wave laser beam is set to the back surface 2b (top surface) of the semiconductor wafer 2 to heat the dividing line 21 where the deteriorated layer 210 has been formed, whereby thermal stress is generated to give a heat shock. As a result, a dividing portion is formed along the dividing line 21 where the deteriorated layer 210 has been formed, and the semiconductor wafer 2 is divided. The laser beam applied along the dividing line 21 where the deteriorated layer 210 has been formed in the dividing step has an output high enough to heat the semiconductor wafer 2 so as to provide a suitable temperature gradient (100 to 400°) and hence, does not melt the silicon wafer.

The processing conditions in the above dividing step are set as follows, for example.

Light source: LD excited Nd:YAG second harmonic laser (CW)
Wavelength: 532 nm
Output: 10 W
Focusing spot diameter: 0.5 µm (heating a relatively wide area including the deteriorated layer 210)
Processing-feed rate: 100 mm/sec After the above dividing step is carried out, the chuck table 51, that is, the semiconductor wafer 2 is indexing-fed by a distance corresponding to the interval between dividing lines 21 in the direction perpendicular to the sheet in FIG. 9 while the continuous wave laser beam is again applied as described above. After the above processing-feeding and indexing-feed are carried out along all the dividing lines 21 formed in the predetermined direction, the chuck table 51, that is, the semiconductor wafer 2 is then turned at 90° to carry out the above processing-feeding and indexing-feed along dividing lines 21 formed in a direction perpendicular to the above predetermined direction, whereby the semiconductor wafer 2 is divided along the dividing lines 21 formed in the semiconductor wafer 2. Although the semiconductor wafer 2 is divided into individual chips along the dividing lines 21, the individual chips do not fall apart and the state of the wafer is maintained as the protective tape 3 is affixed to the front surface 2a of the semiconductor wafer 2.

Figure 10:
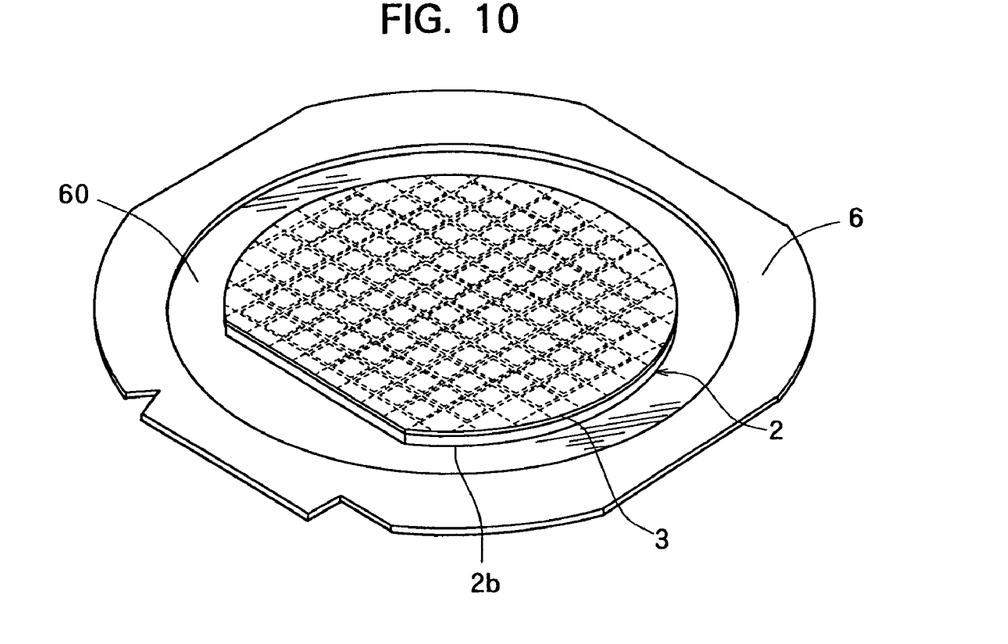
FIG. 10 is a perspective view showing a state where the back surface of a wafer having a deteriorated layer formed thereon is put on the surface of a support tape affixed to an annular frame in the frame supporting step in the wafer processing method of the present invention.

A description will be subsequently given of another embodiment of the dividing step for dividing the semiconductor wafer 2 into individual chips along the dividing lines 21 by exerting external force to the semiconductor wafer 2 in which the deteriorated layer 210 has been formed along the dividing lines 21, with reference to FIGS. 10 to 12.

In this embodiment, a frame supporting step for putting the back surface 2b of the semiconductor wafer 2 on the surface of an extensible support tape affixed to an annular frame is first carried out. That is, as shown in FIG. 10, the back surface 2b of the semiconductor wafer 2 is put on the surface of the support tape 60 affixed to the annular frame 6 (therefore, the protective tape 3 affixed to the front surface 2a of the semiconductor wafer faces up). The above support tape 60 is prepared by applying acrylic resin-based adhesive to the surface of a 70 µm-thick sheet substrate formed of polyvinyl chloride (PVC) to a thickness of about 5 µm in the illustrated embodiment.

After the above frame supporting step, the above support tape 60 is expanded to divide the semiconductor wafer 2 into individual chips along the dividing lines 21. This dividing step is carried out by using a dividing apparatus 7 shown in FIG. 11. The dividing apparatus 7 shown in FIG. 11 comprises a frame holding means 71 for holding the above annular frame 6 and a tape expanding means 72 for expanding the support tape 60 affixed to the annular frame 6 held on the frame holding means 71. The frame holding means 71 comprises an annular frame holding member 711 and a plurality of clamps 712 as fixing means arranged around the frame holding member 711. The top surface of the frame holding member 711 serves as a placing surface 711a for placing the annular frame 6, and the annular frame 6 is placed on the placing surface 711a. The annular frame 6 placed on the placing surface 711a is fixed to the frame holding member 711 by the clamps 712. The frame holding means 71 thus constituted is supported by the tape expanding means 72 in such a manner that it can move in the vertical direction.

The tape expanding means 72 has an expansion drum 721 arranged within the above annular frame holding member 711. This expansion drum 721 has a smaller inner diameter than the inner diameter of the annular frame 6 and a larger outer diameter than the outer diameter of the semiconductor wafer 2 put on the support tape 60 affixed to the annular frame 6. Further, the expansion drum 721 has a support flange 722 at the lower end. The tape expanding means 72 in the illustrated embodiment has a support means 73 which can move the above annular frame holding member 711 in the vertical direction. This support means 73 comprises a plurality of air cylinders 731 installed on the above support flange 722, and their piston rods 732 are connected to the undersurface of the above annular frame holding member 711. The support means 73 comprising the plurality of air cylinders 731 moves the annular frame holding member 711 in the vertical direction between a standard position where the placing surface 711a becomes substantially flush with the upper end of the expansion drum 721 and an expansion position where the placing surface 711a is positioned below the upper end of the expansion drum 721 by a predetermined distance. Therefore, the support means 73 comprising the plurality of air cylinders 731 functions as an expanding and moving means for moving the expansion drum 721 and the frame holding member 711 relative to each other in the vertical direction.

The dividing step which is carried out by using the thus constituted dividing apparatus 7 will be described with reference to FIGS. 12(a) and 12(b). That is, the annular frame 6 supporting the semiconductor wafer 2 (the deteriorated layer 210 is formed along the dividing lines 21) via the support tape 60 as shown in FIG. 10 is placed on the placing surface 711a of the frame holding member 711 constituting the frame holding means 71 and is fixed on the frame holding member 711 by the clamps 712, as shown in FIG. 12(a). At this point, the frame holding member 711 is situated at the standard position shown in FIG. 12(a). The annular frame holding member 711 is lowered to the expansion position shown in FIG. 12(b) by activating the plurality of air cylinders 731 as the support means 73 constituting the tape expanding means 72. Therefore, the annular frame 6 fixed on the placing surface 711a of the frame holding member 711 is also lowered, whereby the support tape 60 affixed to the annular frame 6 comes into contact with the upper edges of the expansion drum 721 to be expanded (tape expansion step), as shown in FIG. 12(b). As a result, tensile force acts radially on the semiconductor wafer 2 put on the support tape 60. When tensile force thus acts radially on the semiconductor wafer 2, the semiconductor wafer 2 is fractured along the deteriorated layers 210 to be divided into individual semiconductor chips 20, as the strength of the deteriorated layer 210 formed along the dividing lines 21 has been reduced. The expansion or elongation of the support tape 60 in this tape expansion step can be adjusted by the downward movement amount of the frame holding member 711. According to experiments conducted by the inventors of the present invention, when the support tape 60 was stretched about 20 mm, the semiconductor wafer 2 could be fractured along the deteriorated layers 210. Although the semiconductor wafer 2 is divided into individual chips 20, the individual chips do not fall apart and the state of the wafer is maintained as the protective tape 3 is affixed to the front surface 2a of the semiconductor wafer 2 and the support tape 60 is affixed to the back surface 2b.

The following dividing methods may be employed, besides the above dividing method.

That is, a method in which the semiconductor wafer 2 put on the support tape 60 (the deteriorated layer 210 is formed along the dividing lines 21) is placed on a soft rubber sheet, and the top surface of the semiconductor wafer 2 is pressed with a roller to divide the semiconductor wafer 2 along the dividing lines 21 whose strength has been reduced by the formation of the deteriorated layers 210 may be employed. Alternatively, a method in which an ultrasonic wave comprising a longitudinal wave (compressional wave) having a frequency of about 28 kHz is applied along the dividing lines 21 whose strength has been reduced by the formation of the deteriorated layers 210, or a method in which a pressing member is applied along the dividing lies 21 whose strength has been reduced by the formation of the deteriorated layers 210 may be employed.

Figure 11:
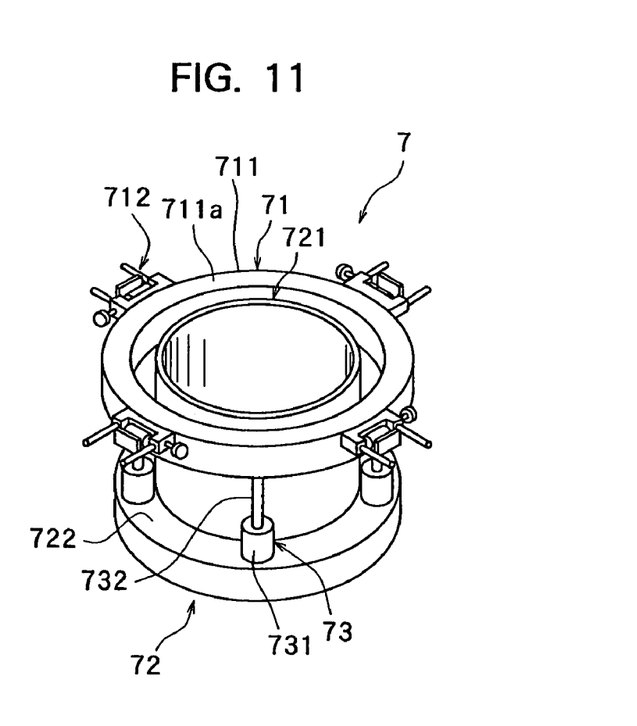
FIG. 11 is a perspective view of a dividing machine for carrying out another embodiment of the dividing step in the wafer processing method of the present invention.
Figure 12:
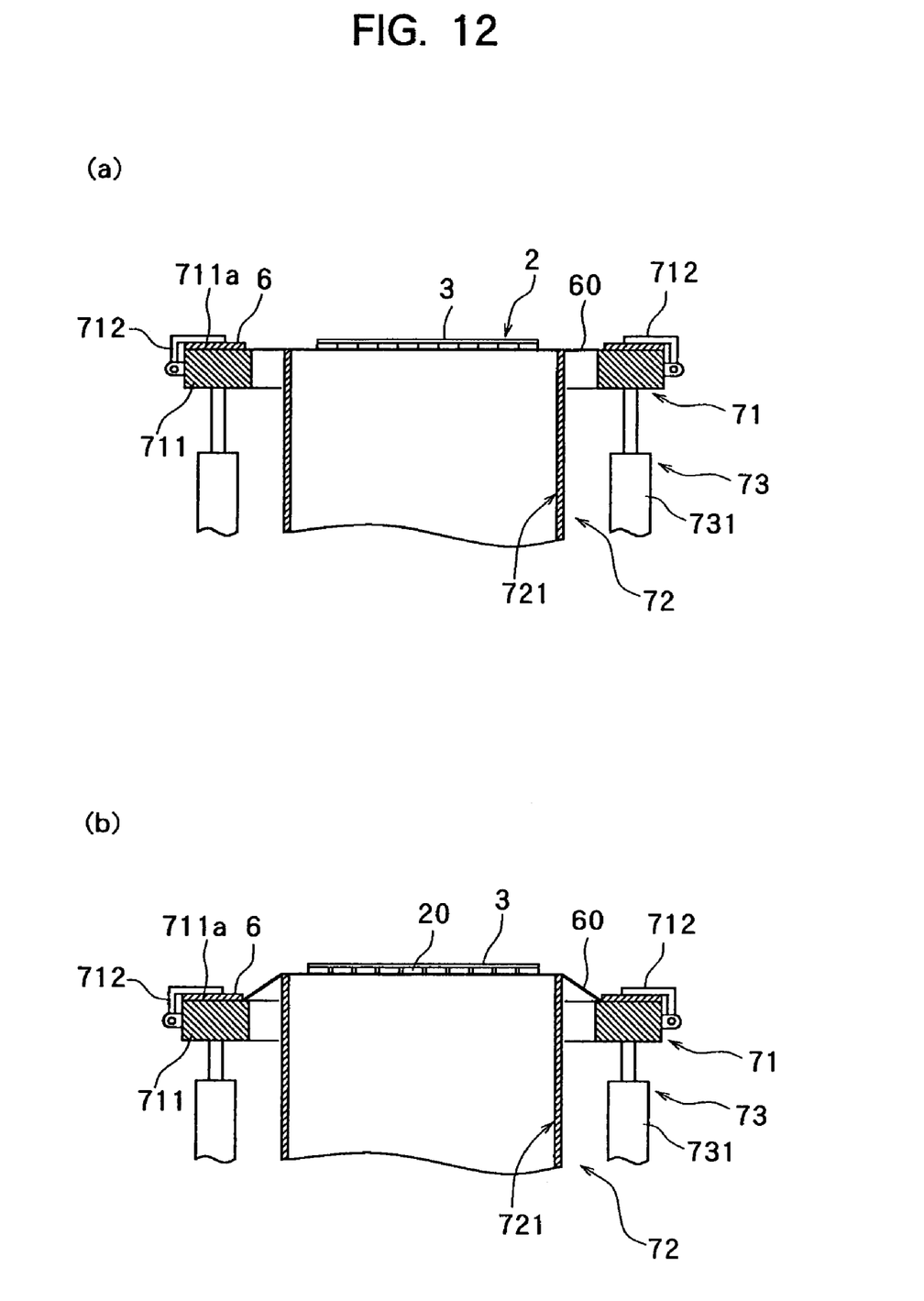
FIGS. 12(a) and 12(b) are explanatory diagrams showing the another embodiment of the dividing step in the wafer processing method of the present invention.
Figure 13:
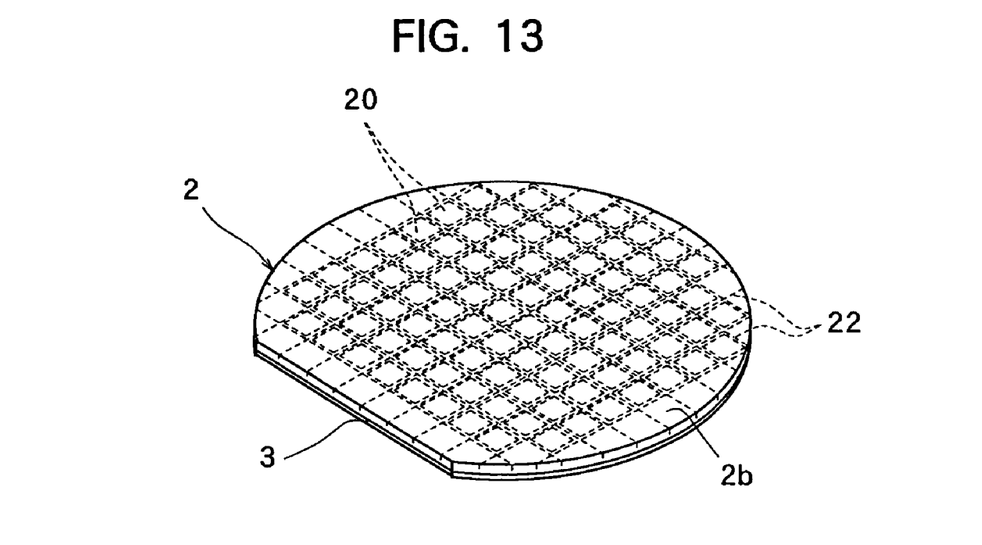
FIG. 13 is a perspective view showing a state where the wafer is peeled off from the support tape affixed to the annular frame after the dividing step in the wafer processing method of the present invention.

After the dividing step is carried out by using the dividing apparatus 7 shown in FIG. 11 as described above, the semiconductor wafer 2 (which is divided into individual semiconductor chips 20) is peeled off from the support tape 60 affixed to the annular frame 6. Since a so-called "UV tape" using adhesive whose adhesive strength is reduced by exposure to ultraviolet radiation is used as the support tape 60, the semiconductor wafer 2 can be easily peeled off from the support tape 60 by applying ultraviolet radiation to the support tape 60 to reduce its adhesive strength after the dividing step. As the protective tape 3 is affixed to the front surface 2a of the semiconductor wafer 2, which has been divided into individual semiconductor chips 20 as shown in FIG. 13, the semiconductor chips 20 do not fall apart and the state of the wafer is maintained. The state shown in FIG. 13 is the same as the state after the dividing step shown in FIG. 9.

Figure 14:
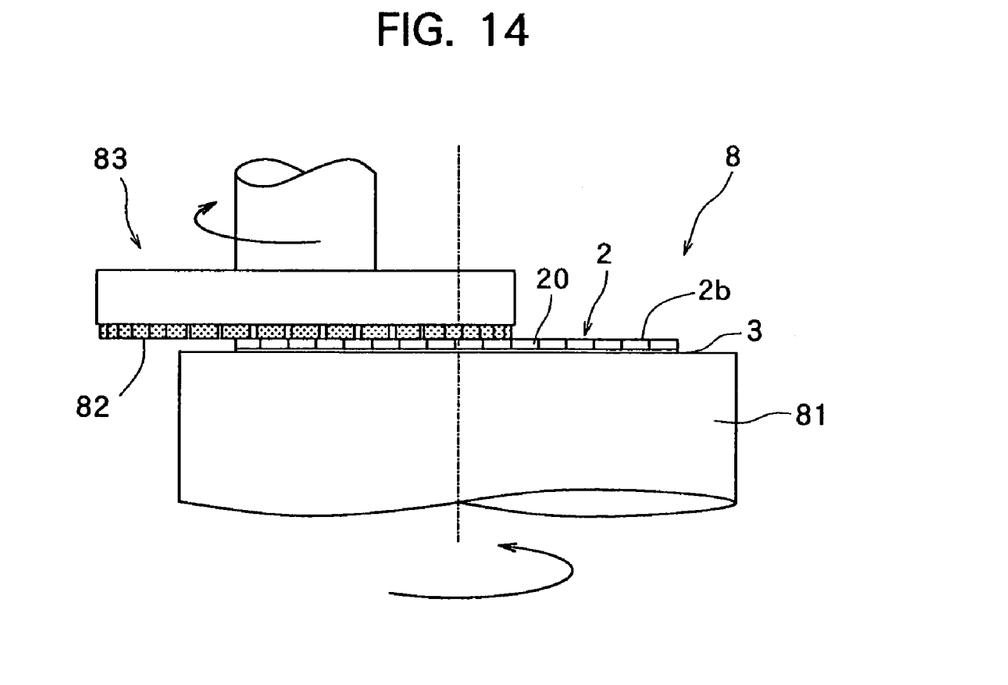
FIG. 14 is an explanatory diagram showing the back surface grinding step in the wafer processing method of the present invention.
Figure 15:
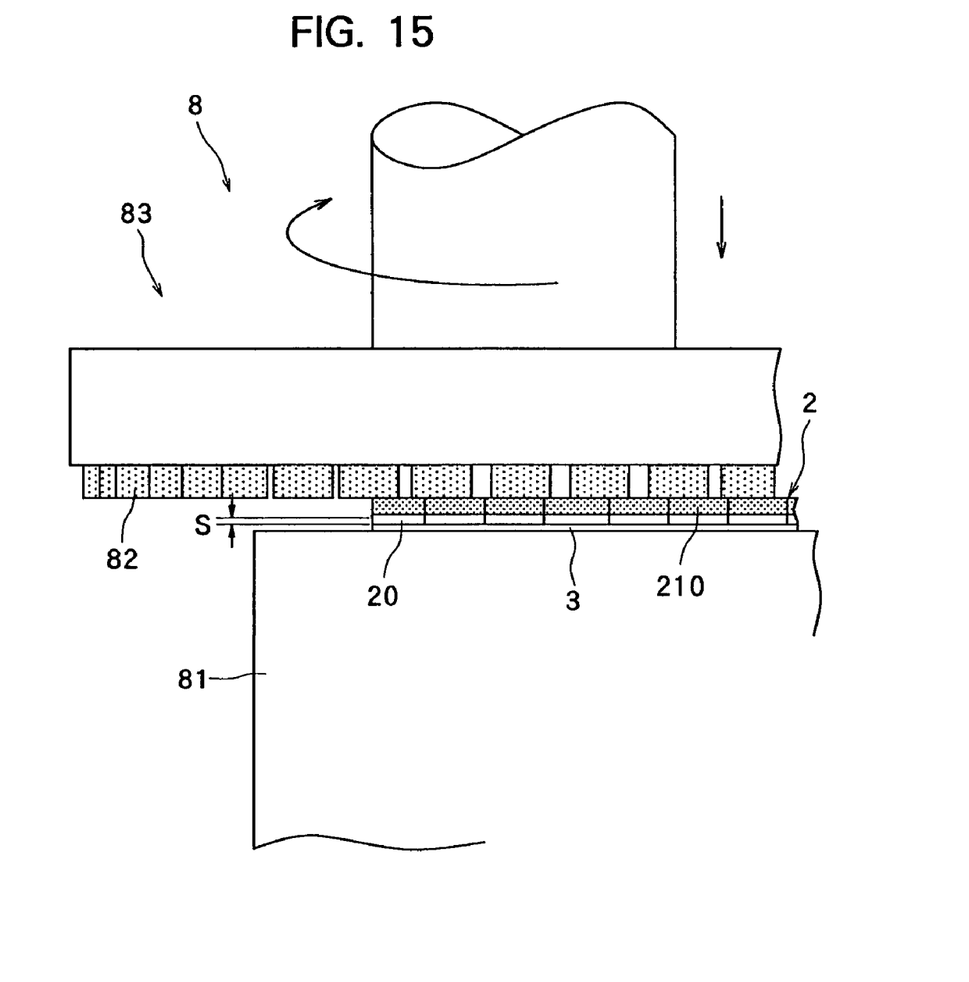
FIG. 15 is an enlarged view of the principal section of the back surface grinding step shown in FIG. 14.
Figure 16:
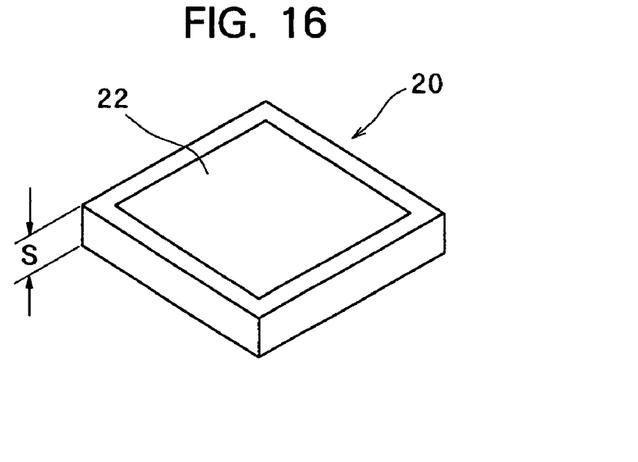
FIG. 16 is a perspective view of a chip obtained by the wafer processing method of the present invention.

After the above dividing step, next comes a back surface grinding step for grinding the back surface 2b of the wafer 2 that has been divided into individual chips, to the predetermined final thickness of the chip. This back surface grinding step is carried out by using a grinding machine 8 shown in FIG. 14. That is, in the grinding step, the protective tape 3 side of the semiconductor wafer 2 which has been divided into individual semiconductor chips 20 is placed on the chuck table 81 of the grinding machine 8 (therefore, the back surface 2b of the semiconductor wafer 2 faces up), and the semiconductor wafer 2 is suction-held on the chuck table 81 by a suction means that is not shown. A grinding tool 83 having a grindstone 82 is rotated at, for example, 6,000 rpm and is processing-fed downward in FIG. 14 at a predetermined rate while the chuck table 41 is rotated at, for example, 300 rpm. This processing-feed is carried out until the final thickness S of the semiconductor chip 20 is attained as shown in FIG. 15. As a result, the deteriorated layers 210 formed in the semiconductor wafer 2 are ground and removed, and the semiconductor wafer 2 is formed to the final thickness S of the semiconductor chip 20. Therefore, as shown in FIG. 16, the deteriorated layer formed by the above deteriorated layer forming step does not remain on the side surfaces of the semiconductor chip 20, whereby the transverse rupture strength of the semiconductor chip 20 does not deteriorate and the transverse rupture strength of 1,000 MPa or more can be secured.

After the back surface grinding step, the semiconductor wafer 2 that has been divided into individual semiconductor chips 20 is conveyed to a picking up step for picking up the semiconductor chips 20.

A description will be subsequently given of another embodiment of the wafer processing method.

Figure 17:
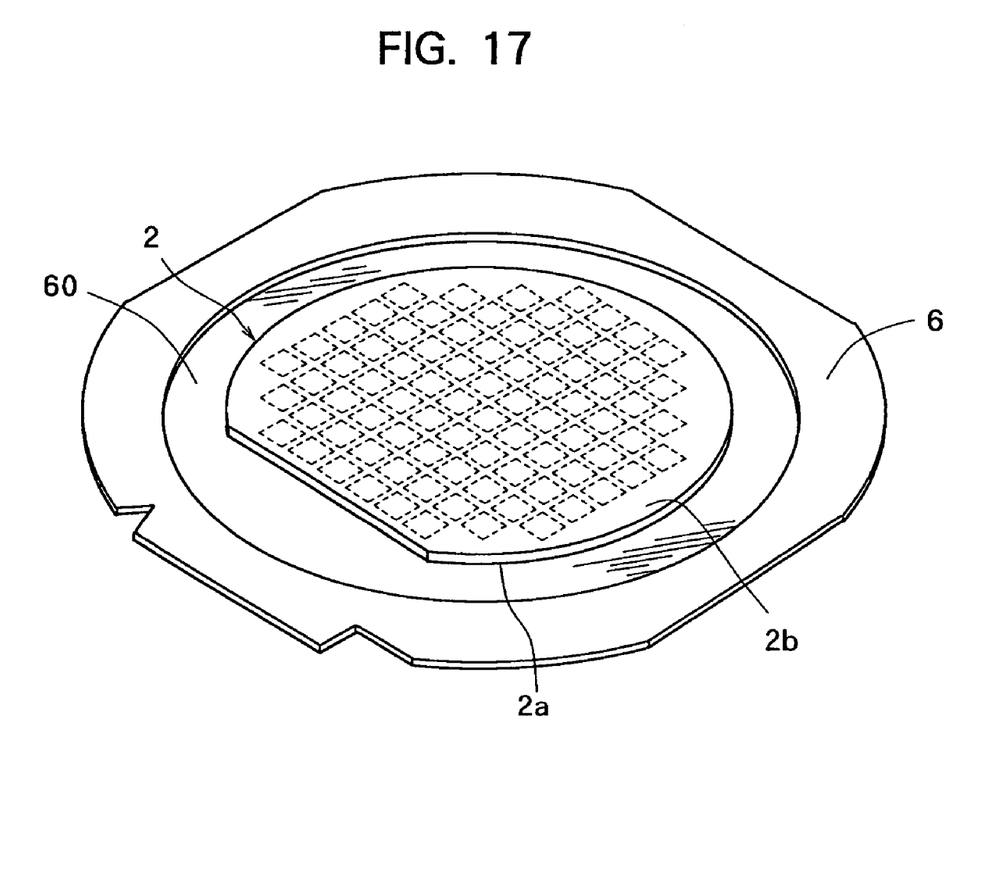
FIG. 17 is a perspective view showing a state where the front surface of a wafer having the deteriorated layer is put on the surface of the support tape affixed to the annular frame in the frame support step in another embodiment of the wafer processing method of the present invention.

In this embodiment, a frame supporting step of putting the front surface 2a of the semiconductor wafer 2 on a support tape affixed to an annular frame is first carried out. That is, as shown in FIG. 17, the front surface 2a of the semiconductor wafer 2 is put on the surface of the support tape 60 affixed to the annular frame 6 (therefore, the back surface 2b of the semiconductor wafer 2 faces up). The support tape 60 is identical to the support tape 60 in the above embodiment shown in FIG. 10.

After the above frame supporting step, next comes a polish-processing step for grinding or polishing the back surface 2b of the semiconductor wafer 2 to a predetermined thickness and for mirror finish-processing the back surface 2b of the semiconductor wafer 2 by polishing it. This polish-processing step is carried out by using the polishing machine 4 shown in FIG. 3 to polish the back surface 2b in the same manner as described above by holding the support tape 60 side on the chuck table 41.

After the polish-processing step, next comes a deteriorated layer forming step for forming a deteriorated layer on the side of the back surface 2b of a position at a distance corresponding to the final thickness of the chip from the front surface 2a along the dividing lines in the inside of the semiconductor wafer 2 by applying a pulse laser beam capable of passing through the wafer along the dividing lines from the polished back surface 2b of the semiconductor wafer 2. This deteriorated layer forming step is carried out by using the laser beam processing machine 5 shown in FIGS. 4 to 6 to form the deteriorated layer 21 along the dividing lines in the same manner as described above by holding the support tape 60 side on the chuck table 51.

A dividing step for dividing the semiconductor wafer 2 into individual chips along the dividing lines 21 by exerting external force to the semiconductor wafer 2 in which the deteriorated layer 210 has been formed along the dividing lines 21 follows the deteriorated layer forming step. In the dividing step, the above dividing apparatus 7 shown in FIG. 11 is used to divide the semiconductor wafer 2 along the dividing lines 21 where the deteriorated layer 210 has been formed by placing the support tape 60 side of the semiconductor wafer 2 supported to the annular frame 6 on the placing surface 711a of the frame holding member 711 constituting the frame holding means 71 and expanding the support tape 60 in the same manner as described above.

Further, in the dividing step, the laser beam processing machine 5 shown in FIGS. 4 to 6 is used to divide the semiconductor wafer 2 along the dividing lines 21 where the deteriorated layer 210 has been formed by holding the support tape 60 side on the chuck table 51 and heating the dividing lines 21 where the deteriorated layer 210 has been formed as described above, to generate thermal stress so as to give a heat shock. When the laser beam processing machine 5 is used in the dividing step as in this embodiment, an extensible expansion tape may not be used as the tape affixed to the semiconductor wafer 2.

A back surface grinding step for grinding the back surface of the wafer divided into individual chips to the final thickness of the chip comes after the above dividing step. In this back surface grinding step, the grinding machine 8 shown in FIG. 14 is used to grind the semiconductor wafer 2 to the final thickness S of the semiconductor chip 20 in the same manner as described above by holding the support tape 60 side on the chuck table 81. As a result, the deteriorated layer 210 formed by the above deteriorated layer forming step does not remain on the side surfaces of the semiconductor chip 20 as shown in FIG. 16, whereby the transverse rupture strength of the semiconductor chip 20 does not lower.

As described above, the above mirror finish-processing step, deteriorated layer forming step, dividing step and back surface grinding step can be carried out in a state where the wafer is supported to the annular frame through the support tape by first carrying out the wafer supporting step for putting the front surface of the semiconductor wafer on the surface of the support tape affixed to the annular frame.

What is claimed is:

1. A wafer processing method for dividing a wafer having function elements in areas sectioned by dividing lines formed on the front surface in a lattice pattern, into individual chips along the dividing lines, comprising:

a deteriorated layer forming step for forming a deteriorated layer on the back surface of the wafer at a distance corresponding to the final thickness of the chip from the front surface of the wafer by applying a laser beam capable of passing through the wafer along the dividing lines from the back surface of the wafer;

a dividing step for dividing the wafer into individual chips along the dividing lines by applying external force to the wafer in which the deteriorated layer has been formed along the dividing lines; and a back surface grinding step for grinding the back surface of the wafer divided into individual chips to remove the entire deteriorated layer and to form the wafer to the final thickness of the chip;

wherein a protective tape affixing step for affixing a protective tape to the front surface of the wafer is carried out before the deteriorated layer forming step; and after the protective tape affixing step, a polish-processing step for polishing the back surface of the wafer is carried out before the deteriorated layer forming step.

2. The wafer processing method according to claim 1, wherein the thickness of the deteriorated layer formed by the deteriorated layer forming step is set to 50% or more of the thickness of the wafer.

3. The wafer processing method according to claim 1, wherein thermal stress is generated in the wafer by heating the dividing lines in which the deteriorated layer has been formed in the dividing step.

4. The wafer processing method according to claim 1, wherein the dividing step comprises a frame supporting step for putting the back surface of the wafer subjected to the deteriorated layer forming step on an extensible support tape affixed to an annular frame and a tape expansion step for expanding the support tape affixed to the back surface of the wafer, and the above back surface grinding step comprises a wafer peeling step for peeling off the wafer from the support tape after the tape expansion step to grind the back surface of the wafer in a state where the protective tape is affixed to the front surface of the wafer.

5. A wafer processing method for dividing a wafer having function elements in areas sectioned by dividing lines formed on the front surface in a lattice pattern, into individual chips along the dividing lines, comprising:

a frame supporting step for putting the front surface of the wafer on a support tape affixed to an annular frame;

a deteriorated layer forming step for forming a deteriorated layer on the back surface of the wafer at a distance corresponding to the final thickness of the chip from the front surface of the wafer by applying a laser beam capable of passing through the wafer along the dividing lines from the back surface of the wafer supported by the annular frame through the support tape;

a dividing step for dividing the wafer into individual chips along the dividing lines by applying external force to the wafer in which the deteriorated layer has been formed along the dividing lines; and a back surface grinding step for grinding the back surface of the wafer divided into individual chips to remove the entire deteriorated layer and to form the wafer to the final thickness of the chip;

wherein, after the frame supporting step, a polish-processing step for polishing the back surface of the wafer is carried out before the deteriorated layer forming step.

6. The wafer processing method according to claim 5, wherein the thickness of the deteriorated layer formed by the deteriorated layer forming step is set to 50% or more of the thickness of the wafer.

7. The wafer processing method according to claim 5, wherein thermal stress is generated in the wafer by heating the dividing lines in which the deteriorated layer has been formed in the dividing step.

8. The wafer processing method according to claim 5, wherein the support tape affixed to the annular frame is an extensible tape and expanded in the dividing step.

* * * * *